United States Patent
Geppert et al.

(10) Patent No.: US 10,495,708 B2
(45) Date of Patent: Dec. 3, 2019

(54) METHOD AND APPARATUS FOR GENERATING A MAGNETIC RESONANCE IMAGE WITH RADIO COLLECTION OF MAGNETIC RESONANCE DATA TO AVOID IMAGE ARTIFACTS

(71) Applicant: Siemens Healthcare GmbH, Erlangen (DE)

(72) Inventors: Christian Geppert, Erlangen (DE); Robert Grimm, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 210 days.

(21) Appl. No.: 15/419,239

(22) Filed: Jan. 30, 2017

(65) Prior Publication Data
US 2017/0219670 A1  Aug. 3, 2017

(30) Foreign Application Priority Data
Feb. 1, 2016 (DE) ........................ 10 2016 201 458

(51) Int. Cl.
*G01R 33/48* (2006.01)
*G01R 33/483* (2006.01)

(52) U.S. Cl.
CPC ....... *G01R 33/4826* (2013.01); *G01R 33/483* (2013.01); *G01R 33/4824* (2013.01)

(58) Field of Classification Search
CPC ............ G01R 33/4824; G01R 33/4826; G01R 33/483
See application file for complete search history.

(56) References Cited

U.S. PATENT DOCUMENTS

| | | | |
|---|---|---|---|
| 6,411,089 B1 | 6/2002 | Anand et al. | |
| 7,548,062 B1 | 6/2009 | Gurney | |
| 2007/0182412 A1* | 8/2007 | Katscher | G01R 33/4824 324/309 |
| 2014/0084916 A1* | 3/2014 | Greiser | G01R 33/4826 324/306 |
| 2014/0084919 A1 | 3/2014 | Johnson | |
| 2015/0241538 A1 | 8/2015 | Lu et al. | |

OTHER PUBLICATIONS

Piccini et al., "Spiral Phyllotaxis: The Natural Way to Construct a 3D Radial Trajectory in MRI," Magnetic Resonance in Medicine, vol. 66, pp. 1049-1056; (2011).

* cited by examiner

*Primary Examiner* — Rishi R Patel
(74) *Attorney, Agent, or Firm* — Schiff Hardin LLP

(57) ABSTRACT

For the creation of a magnetic resonance (MR) image of a predetermined volume section of an object of investigation, MR data of the volume section are collected along radial trajectories, and each trajectory is assigned a readout direction in which the MR data are collected along the respective trajectory. The MR image is reconstructed on the basis of the collected MR data. In the reconstruction, only MR data are taken into consideration that were collected along trajectories with a readout direction restricted to the field of a solid angle that is defined by a partial surface of a sphere. The partial surface (A) at most corresponds to 75% of the total surface of the sphere.

9 Claims, 5 Drawing Sheets

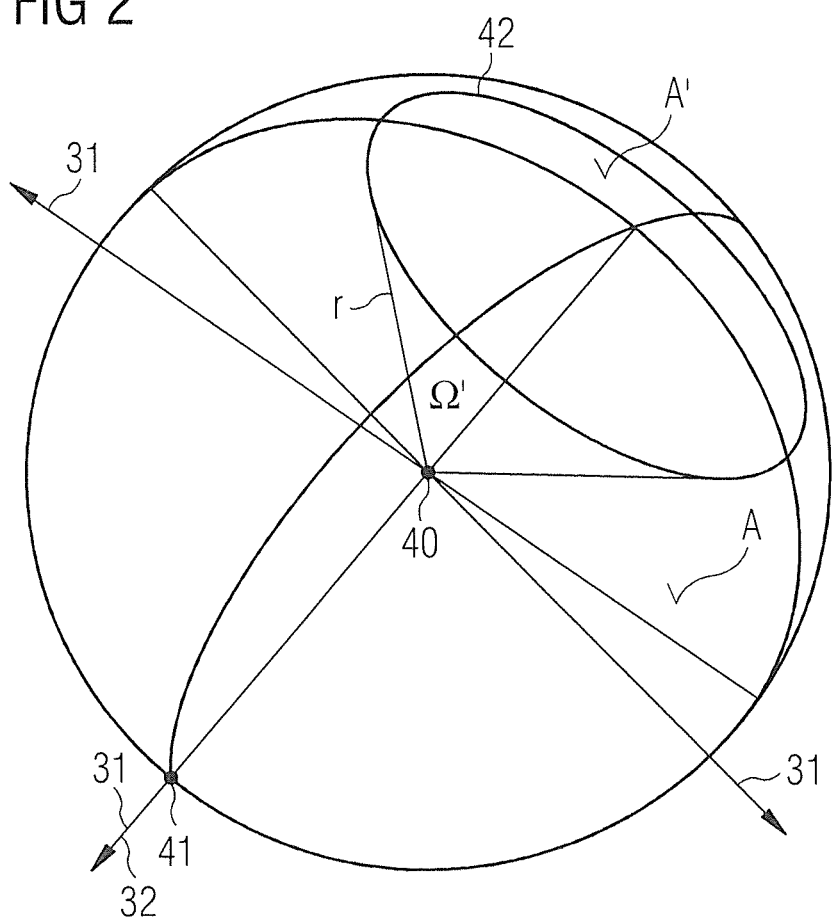

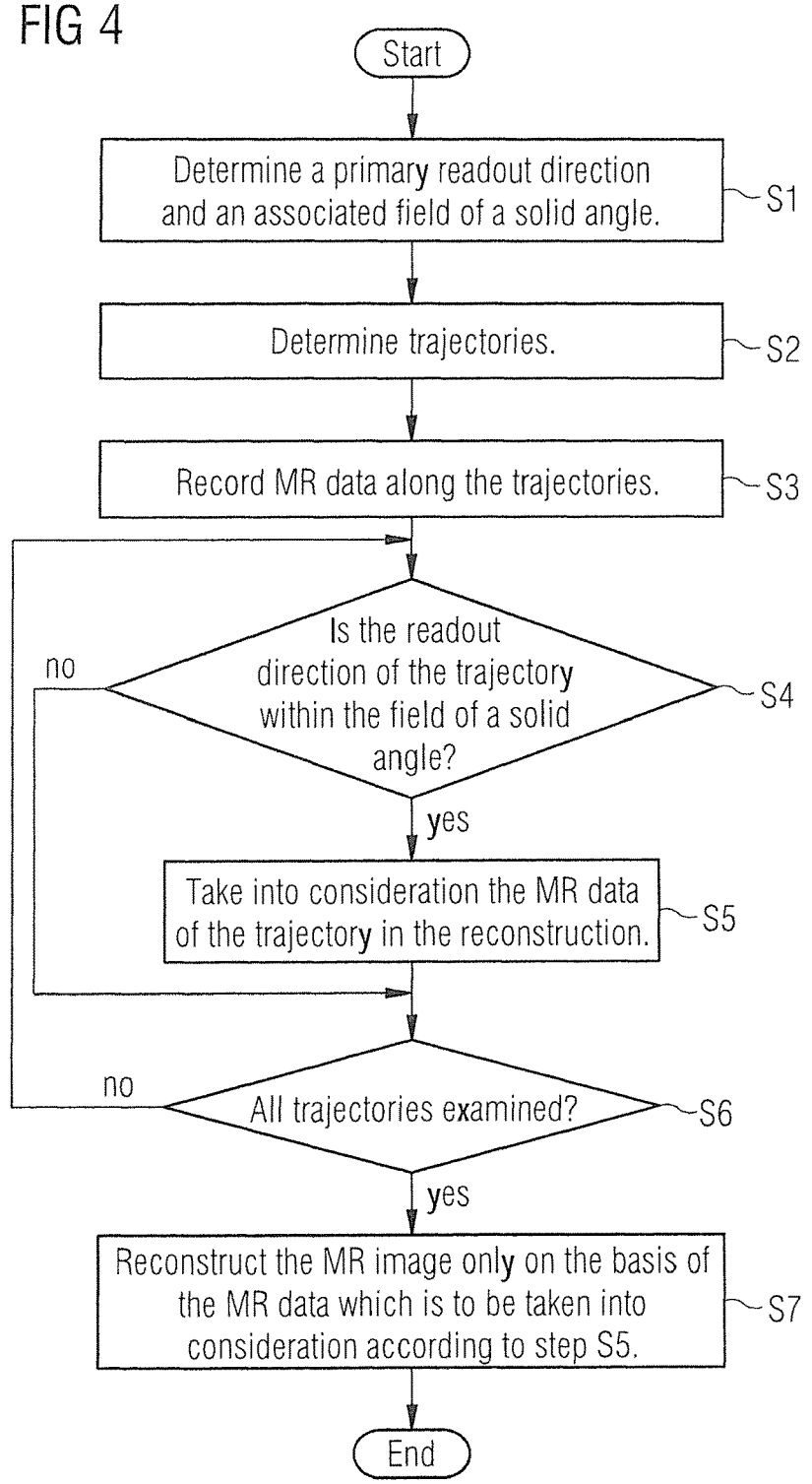

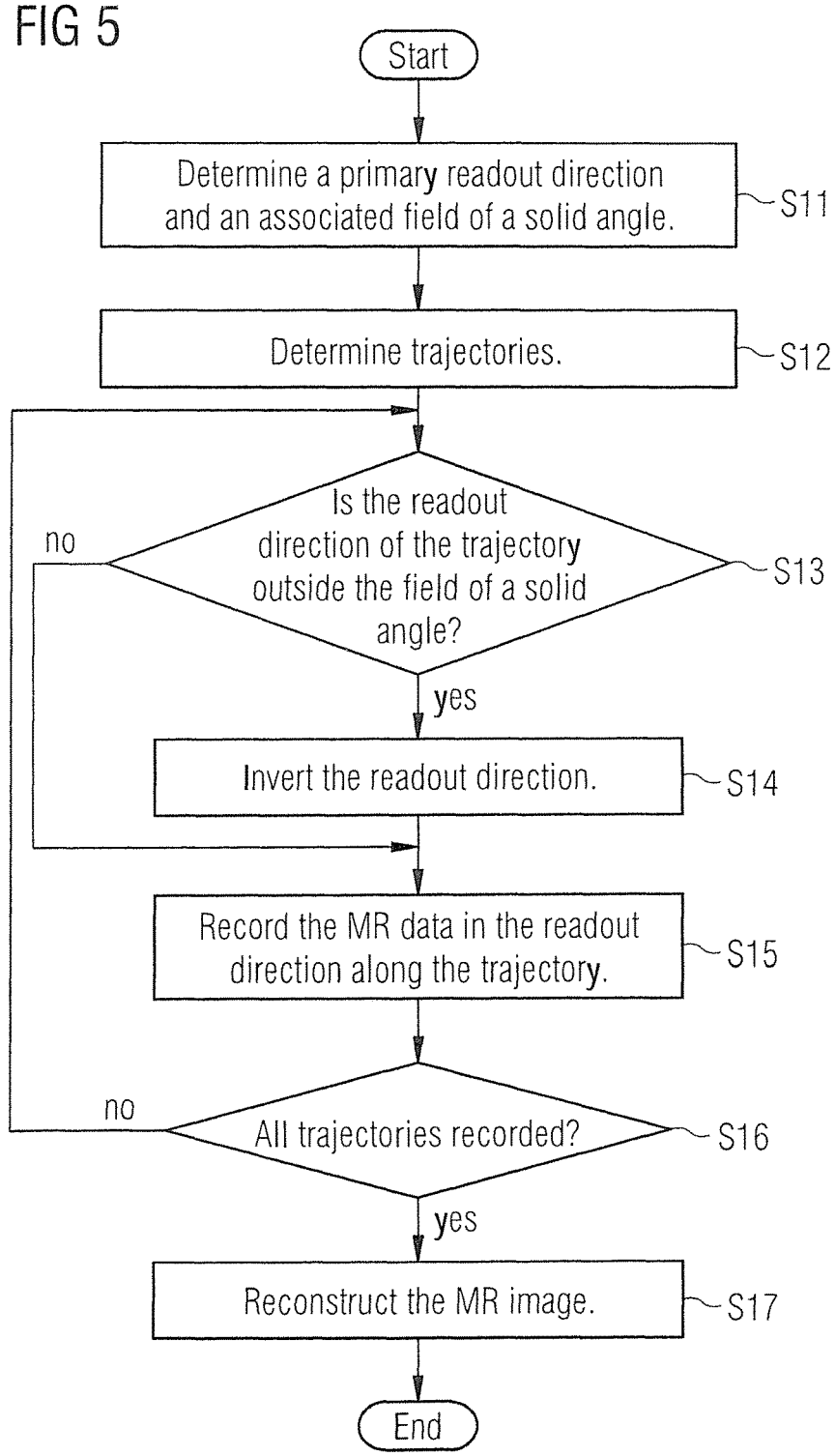

METHOD AND APPARATUS FOR GENERATING A MAGNETIC RESONANCE IMAGE WITH RADIO COLLECTION OF MAGNETIC RESONANCE DATA TO AVOID IMAGE ARTIFACTS

BACKGROUND OF THE INVENTION

Field of the Invention

The present invention concerns the reconstruction of a magnetic resonance (MR) image from radial collection of MR data in a manner that avoids artifacts (in particular, artifacts caused by metal parts).

Description of the Prior Art

In magnetic resonance imaging, raw data (magnetic resonance measurement data) are acquired from a subject by the operation of a magnetic resonance scanner in which the subject is situated. The acquired raw data are entered as complex numbers at respective data points of a memory. This collection of raw data in the memory is known as k-space data. The entry of the raw data at the respective data points of the memory is known as "scanning" k-space, or scanning a k-space memory. The path composed of data points along which the raw data are successively entered in k-space is known as a "k-space trajectory."

The k-space data are then transformed into image data, typically by operation of a Fourier transform on the k-space data. The k-space trajectory that is used to enter the raw data into k-space may have an influence on the type or degree of artifacts that may occur in the image represented by the image data. Trajectories such as a Cartesian trajectory, which proceeds along a rectilinear path, and a radial trajectory, which proceeds radially outwardly from a center of k-space to a periphery of k-space, are among the known types of k-space trajectories.

The radial scanning of k-space, which is also referred to as the radial collection of MR data, is a known method, for obtaining T1-weighted MR data, for example, which is used for musculoskeletal imaging (imaging of the musculoskeletal system.

Compared with the traditional Cartesian collection of MR data, the radial collection of MR data has the advantage of being less sensitive to movement. However, the radial collection of MR data is more sensitive to system failures such as gradient delays and off-resonance effects. For example, sensitivity with regard to artifacts caused by metal parts is more pronounced in the case of the radial collection of MR data than in the case of the Cartesian collection of MR data.

SUMMARY OF THE INVENTION

It is an object of the present invention to improve the reconstruction of an MR image based on radially recorded MR data so that sensitivity to interference (in particular, interference caused by metal parts) in the reconstructed MR image is reduced compared to the prior art.

In accordance with the present invention, a method for generating an MR image of a predetermined volume section within an object of investigation by operation of a magnetic resonance system is provided. The method according to the invention includes the following steps.

MR data (raw data) of the volume section are acquired by operation of an MR data acquisition scanner, and are entered into a memory organized as k-space along arbitrary radial trajectories. Each of the trajectories is assigned an individual readout direction. The respective readout direction indicates the direction in which the MR data are recorded along the respective trajectory.

This results in the memory being populated with k-space data. An MR image is reconstructed using only k-space data that were entered along those trajectories having a readout direction restricted to the field of a solid angle that is defined by a partial surface of a sphere. This partial surface consists of only 75% maximum of the surface of the sphere. This partial surface is contiguous and has no holes therein. Preferably, the partial surface is delineated by a circle.

The term trajectory is understood to mean a spatial curve or a path along which some of the MR data to be recorded is scanned. Accordingly, a number of such trajectories must be scanned to record all the MR data for the MR image. The MR data of each of these trajectories can be recorded using one readout (i.e. based on only one RF excitation pulse), or a number of readouts.

Each readout direction of each of the trajectories corresponds to a vector. When this vector passes through the center of the sphere, this vector points to a certain point of the sphere's surface. According to the invention, the MR data recorded along this trajectory (to which the readout direction and/or the vector is assigned) is taken into consideration in the reconstruction of the MR image only if this point is on the partial surface. Conversely, MR data recorded along a trajectory with a readout direction and/or corresponding vector that points to a point of the sphere's surface that is not on the predetermined partial surface are not taken into consideration in the reconstruction of the MR image.

According to the prior art, the readout directions of the trajectories of the recorded MR data, using image reconstruction are isotropically distributed. This means that if vectors corresponding to those readout directions were formed, those vectors would point to respective points over the entire surface of a sphere. The readout directions of the trajectories of the MR data not taken into consideration in reconstruction are not isotropically distributed according to the present invention.

With known radial MR data capture, the MR data are recorded along trajectories with readout directions that run (virtually) antiparallel to other trajectories. The likelihood that the MR data are recorded along trajectories with readout directions that run antiparallel is greatly reduced by the present invention. Advantageously, sensitivity to off-resonance artifacts can therefore be greatly reduced.

Advantageously, the trajectories along which the MR data are recorded according to the respective readout direction all pass through the same point which corresponds to the center point of the sphere. Preferably, the trajectories are linear.

According to the invention, two basic variants cane be considered.

In the first variant, the MR data are recorded along radial trajectories with arbitrary readout directions, but only that MR data are used for the reconstruction of the MR image that were recorded on the basis of trajectories with a readout direction in the predetermined field of the solid angle.

In the second variant, the MR data are recorded only along radial trajectories with readout directions in the predetermined field of the solid angle. As a result, all the recorded MR data can be used for the reconstruction of the MR image.

The second variant can be seen as an embodiment of the first variant. With the first variant, arbitrary radial trajectories are used to record the MR data, but the trajectories for the second variant are limited to the field of a solid angle in terms of their readout directions. Therefore, all the MR data can be used for reconstruction with the second variant. In other words, the restriction of the MR data used in image reconstruction (according to the first variant) to that MR data recorded on the basis of trajectories with a readout direction in the predetermined field of a solid angle would not lead to any (genuine) restriction in the case of the second variant because, according to the second variant, the MR data area already recorded only along trajectories with readout directions in the predetermined field of a solid angle.

Therefore, the present invention also encompasses the following method to create an MR image of a predetermined volume section within an object of investigation by operation of a magnetic resonance system. This method includes the following steps.

MR data (raw data) of the volume section are acquired by operation of an MR data acquisition scanner, and are entered into a memory organized as k-space along arbitrary radial trajectories. Each of the trajectories is assigned an individual readout direction. The respective readout direction indicates the direction in which the MR data are recorded along the respective trajectory. The MR data are acquired only along trajectories having a readout direction restricted to the field of a solid angle that is defined by a partial surface of a sphere. This partial surface consists of only 75% maximum of the surface of the sphere. This partial surface is contiguous and has no holes therein. Preferably, the partial surface is delineated by a circle.

This results in the memory being populated with k-space data. An MR image is reconstructed using all of the k-space data that were acquired.

All the embodiments described relate both methods according to the invention.

In a preferred embodiment of the invention, the partial surface consists of only 50% or half of the sphere surface. In this embodiment, the partial surface corresponds to the spherical and/or curved external surface of a hemisphere.

According to a further preferred embodiment of the invention, the trajectories are situated only on one plane. The field of the solid angle corresponds to or distorts into a flat angular field that is restricted to 270°, or better to 180°. Similarly, in this embodiment the sphere corresponds to or distorts into a circle and the partial surface into the corresponding part of a circumference (at 270° into three quarters of a circle(circumference) and at 180° into a semicircle (circumference)).

Thus, the present invention can be used to scan a two-dimensional k-space with trajectories that are in one plane. Also, three-dimensional k-spaces can be recorded with the present invention by scanning k-space with trajectories that are not only in one plane. Naturally, with the aforementioned embodiment, in which the trajectories are only in one plane, a three-dimensional k-space can also be scanned by radially scanning k-space in layers (for example, using the known stack-of-stars method).

According to the invention, a primary readout direction can be determined. Depending on this primary readout direction, the field of the solid angle can then be determined such that the primary readout direction is in the center of the field of the solid angle.

If the primary readout direction in this embodiment is imagined as a vector that passes through the center of the sphere, this vector points to a point of the partial surface that is in the center of the partial surface. When the partial surface, for example, corresponds to a circular area projected onto a plane, this center corresponds to the central point of this circular area.

In the two-dimensional case (i.e. the trajectories are in a plane), the primary readout direction, as a vector that passes through the central point of the circle, points to a point that divides the partial circle (circumference) into two equal halves.

In order to determine the primary readout direction, a direction can be determined from the central point (of the sphere or the circle) to an imperfection in the magnetic fields that exist in the imaging volume of the scanner (for example, due to a metal part). The primary readout direction can then be defined or determined depending on this predetermined direction.

Because the artifacts caused by an imperfection generally occur before the imperfection or after the imperfection (seen in the readout direction), the primary readout direction is determined parallel or antiparallel to the predetermined direction.

The primary readout direction can be determined dependent on the predetermined direction (usually parallel or antiparallel to this direction) depending on the material that exhibits the imperfection, and/or depending on the position of the imperfection and/or depending on properties of a measurement sequence (for example, spin-echo sequence or gradient-echo sequence) with which the MR data are recorded.

As noted, artifacts (in the readout direction) may occur either before or after the interfering object and/or the imperfection (position of the imperfection). For example, signal voids occur in the readout direction after the object, and a so-called pile up occurs in the readout direction before the object. How pronounced the artifacts are also depends on the recording parameters, such as the receiver bandwidth. If the direction from the central point (of the sphere) to the imperfection is known, the primary readout direction can be determined depending on the material properties of the imperfection and/or depending on properties of the measurement sequence parallel or antiparallel to this direction.

According to a further embodiment of the invention, reconstructing the MR image is performed several times, with a different primary readout direction being used for each repetition. The final MR image can be created or reconstructed as a combination of the MR images reconstructed for the respective readout directions.

Because the artifacts depend on the primary readout direction, the artifacts are different in two MR images that are reconstructed from the same MR data, but with different primary readout directions according to the invention. Because the actual and/or undisturbed image content in both MR images is the same, at least those artifacts that are present in only one of the MR images can be eliminated.

In two-dimensional MR data collection, the MR image can be reconstructed, for example, four times from the MR data, wherein the primary readout directions each differ by 90°. In general, the MR data according to the invention can be reconstructed n-times, with the primary readout directions each differing by 360°/n.

In a three-dimensional MR data collection, the MR image can be reconstructed, for example, six times with different primary readout directions, wherein two primary readout directions are antiparallel and the remaining four readout directions are of a plane perpendicular to the two antiparallel readout directions. The remaining four readout directions may then differ, for example, by 90° each (measured in the plane).

In this embodiment, the MR data are generally collected conventionally (i.e. without taking into account the field of a solid angle when collecting the MR data). Only when reconstructing the respective MR image, then only that MR data that were collected along trajectories with a readout direction restricted to the field of a solid angle that is defined by the respective primary direction in space are used for reconstruction. It is also possible according to the invention to collect MR data individually for each of the primary readout directions, MR data thus being collected individually for each primary readout direction along trajectories with a readout direction that is restricted to the field of a solid angle defined by the respective primary direction in space.

According to the invention, reconstruction with a number of different primary readout directions can also be used to collect one or more imperfections or the position(s) of one or more imperfections (i.e. to locate the imperfection(s)) when evaluating the MR data.

Through awareness of the imperfection(s) and the precise position of the imperfection(s), the probability of the occurrence of artifacts in the MR image to be reconstructed can be reduced in the imperfection(s) or in the vicinity of the imperfection(s).

According to a further embodiment of the invention, collecting the MR data can be performed by the following substeps.

Arbitrary linear trajectories are determined that all run through the central point (of the sphere). Each trajectory is defined by its readout direction.

A sequence in which the trajectories are to be scanned is determined.

MR data are acquired by collecting the MR data along the trajectories in the predetermined sequence. If, in the process, it is discerned that the readout direction of a respective trajectory is outside the predetermined field of a solid angle, the readout direction is reversed (so the reversed readout direction is antiparallel to the original readout direction).

This embodiment corresponds to the aforementioned second variant of the invention. This embodiment enables scanning methods known in the prior art (such as a scanning method according to the golden angle or so-called bit-reversed sampling) to be implemented according to the invention and all the collected MR data to also be used to reconstruct the MR image. With the known two-dimensional scanning method, according to the golden angle, for example, the readout direction of the first trajectory is 0°, the readout direction of the second trajectory 111.25°, the readout direction of the third trajectory 222.5° and the readout direction of the n-th trajectory (n−1)*111.25°. If in this example the permitted angular field is set to be 0° to 180°, for example, the readout direction of the third trajectory is reversed so that the reversed readout direction (in which the MR data are then scanned along the third trajectory) corresponds to 222.5°−180°=42.5°.

The present invention also encompasses a magnetic resonance apparatus to create an MR image from a predetermined volume section in an object of investigation. The magnetic resonance apparatus has a scanner that has a basic field magnet, a gradient field system, at least one RF antenna and a control computer to control the gradient field system and the at least one RF antenna, in order to receive the measurement signals recorded by the RF antenna(e) and to evaluate the measurement signals and to create or reconstruct the MR images. The magnetic resonance apparatus is designed to collect MR data of the volume section by the magnetic resonance system along radial trajectories. Each of these trajectories is assigned a readout direction in which the MR data are collected along the respective trajectory. Based on the collected MR data, the control computer reconstructs the MR image. In the reconstruction, the control computer uses only the MR data that were collected along trajectories with a readout direction restricted to the field of a solid angle that is defined by a partial surface of a sphere. This partial surface corresponds to 75% of the total surface of the sphere.

The advantages of the magnetic resonance apparatus according to the invention essentially correspond to the advantages of the method according to the invention explained in detail above.

As explained with the method according to the invention, the invention also encompasses a magnetic resonance apparatus designed to perform the method according to the second variant of the inventive method.

The present invention also encompasses a non-transitory, computer-readable data storage medium encoded with programming instructions (program code) that, when the storage medium is loaded into a control computer or computer system of a magnetic resonance apparatus, cause any or all of the embodiments of the method according to the invention to be implemented. The program code may require program resources, such as libraries and auxiliary functions, to realize the corresponding embodiments of the method. The software may be a source code (for example, C++) which has still to be compiled (translated) and linked or which only interpreted, or an executable software code that only needs to be downloaded into the corresponding computing unit and/or control device for execution.

Examples of the electronically readable data carrier are a DVD, a magnetic tape, a hard disk or a USB stick.

With radial MR data collection, antiparallel readout directions, in particular in the region of the primary readout direction, are avoided in the reconstruction by the present invention, enabling phase cancellations or readout noise in this direction (primary readout direction) to be avoided.

When a patient has a metal clip in the anterior chest wall, for example, the primary readout direction can be adjusted to 90° (posterior->anterior) in an axial scan, as a result of which artifacts are advantageously shifted away from the body of the patient. Likewise, in an axial scan the primary readout direction can be adjusted to 270° when the patient has their metal clip in the rear chest wall.

In contrast to the known SEMAC method, the present invention has the advantage that the scan time need not be extended in comparison with known radial MR data collection (without taking into account the field of a solid angle).

BRIEF DESCRIPTION OF THE DRAWINGS

FIG. 2 shows the field of a solid angle permitted according to the invention, as an example.

FIG. 4 is a flowchart of a first embodiment of the method according to the invention.

FIG. 5 is a flowchart of a second embodiment of the method according to the invention.

DESCRIPTION OF THE PREFERRED EMBODIMENTS

Figure 1:
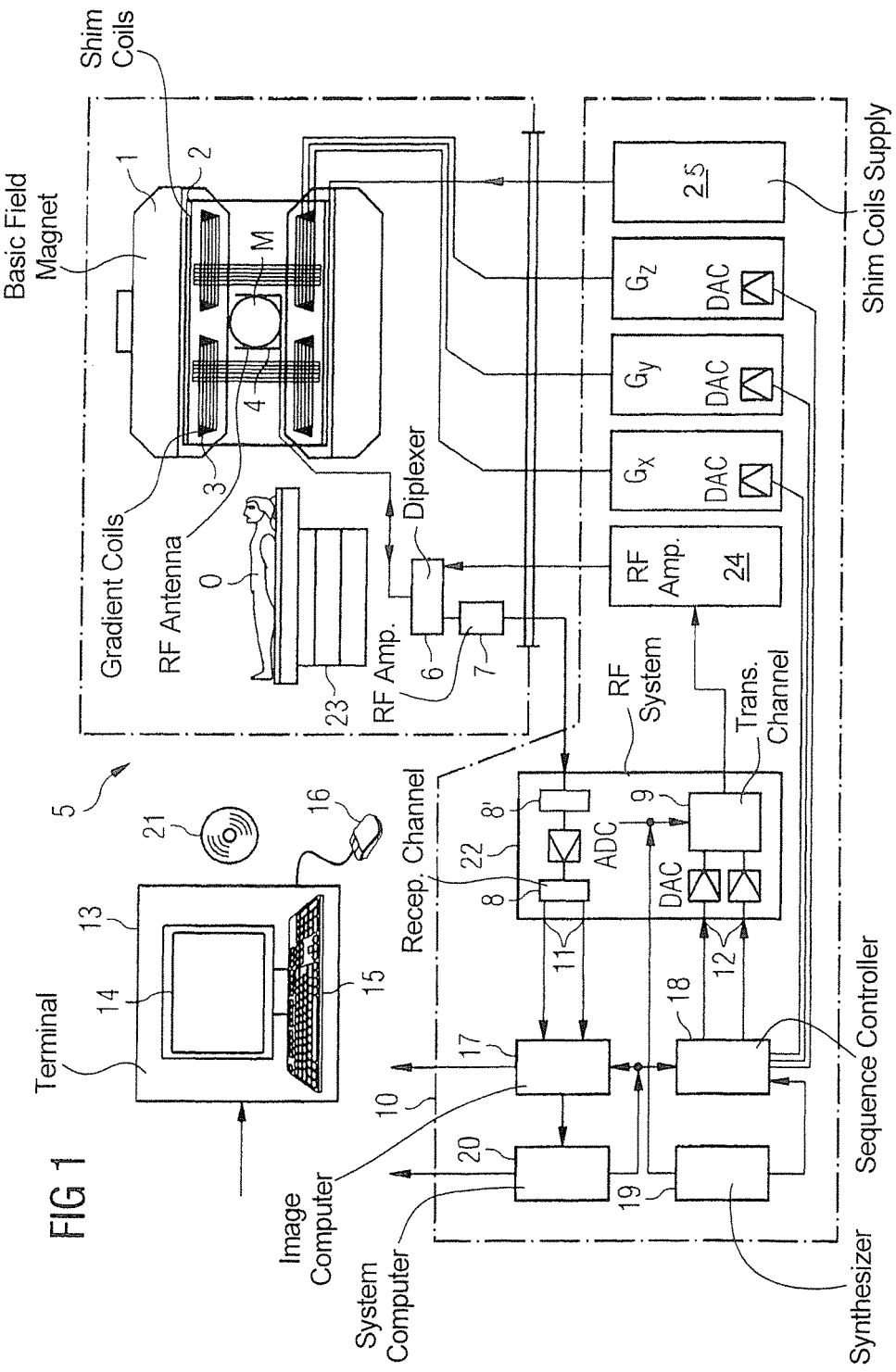
FIG. 1 is a block diagram of a magnetic resonance apparatus according to the invention.

FIG. 1 is block diagram of a magnetic resonance apparatus 5 according to the invention (a magnetic resonance imaging tomography apparatus). The apparatus has an MR data acquisition scanner that has a basic field magnet 1 that generates a time-constant, strong magnetic field for the polarization and/or alignment of the nuclear spins in an examination area of an object O, for example, of a part of a human body for examination, lying on a table 23 in the scanner. The high degree of homogeneity of the basic magnetic field that is necessary for a magnetic resonance measurement is defined in a typically spherical measurement volume M, in which the volume section of the human body for examination is situated. To support the requirements for homogeneity, in particular to eliminate time-invariable influences, so-called Shim plates of ferromagnetic material are attached at appropriate points. Time-variable influences are eliminated by shim coils 2 fed by a shim coils supply 25.

In the basic field magnet 1, a cylindrical gradient field system 3 composed of three sub-windings is used. Each sub-winding is supplied with power by an amplifier to generate a linear (also time variable) gradient field in the respective direction of a Cartesian coordinate system. The first sub-winding of the gradient field system 3 generates a gradient $G_x$ in the x direction, the second sub-winding a gradient $G_y$ in the y direction and the third sub-winding a gradient $G_z$ in the z direction. Each amplifier has a digital-analog converter controlled by a sequence controller 18 for the timely generation of gradient pulses.

Within the gradient field system 3 there is one (or more) radio-frequency antennae 4 that convert radio-frequency pulses supplied thereto from an RF amplifier 24 into a magnetic alternating field for the excitation of nuclei and deflection of the nuclear spins of the object for examination O and/or the area of the object O for examination. Each radio-frequency antenna 4 is formed by one or more RF transmitter coils and one or more RF receiver coils in the form of a ring-shaped, preferably linear or matrix-shaped, arrangement of component coils. Via the RF receiver coils of the respective radio-frequency antenna 4, the alternating field emanating from the precessing nuclear spins, usually nuclear spin echo signals provoked by a pulse sequence from one or more radio-frequency pulses and one or more gradient pulses, is also converted into a voltage (measurement signal), which is supplied to a radio-frequency reception channel 8 of a radio-frequency system 22 via an amplifier 7. The radio-frequency system 22, which is part of a control computer 10 of the magnetic resonance apparatus 5, furthermore has a transmission channel 9 in which the radio-frequency pulses for the excitation of nuclear magnetic resonance are generated. The respective radio-frequency pulses are represented digitally as complex numbers based on a pulse sequence predetermined by the system computer 20 in the sequence controller 18. This numerical sequence is supplied to a digital-to-analog converter in the radio-frequency system 22 as a real part and an imaginary part via respective inputs 12, and supplied to the transmission channel 9. In the transmission channel 9, the pulse sequences are modulated onto a radio-frequency carrier signal with a basic frequency that corresponds to the resonance frequency of the nuclear spins in the measurement volume.

Switching between transmit mode and receive mode takes place via a duplexer 6. The RF transmitter coils of the radio-frequency antenna(e) 4 emit(s) radio-frequency pulses to excite the nuclear spins in the measurement volume M, and resulting echo signals are detected via the RF-receiver coil(s). The correspondingly acquired magnetic resonance signals are phase-sensitively demodulated onto an intermediate frequency in the reception channel 8' (first demodulator) of the radio-frequency system 22, digitized in the analog-to-digital converter (ADC) and emitted via the output 11. This signal is additionally demodulated to a frequency of 0. Demodulation to the frequency of 0 and separation into real and imaginary parts takes place after digitization in the digital domain, in a second demodulator 8. An MR image is reconstructed by an image processor 17 from the measurement data acquired in such a way via the output 11. The measurement data, the image data and the control programs are managed by the system computer 20. Based on a specification with control programs, the sequence controller 18 controls the generation of the desired pulse sequences and the corresponding scanning of k-space. In particular, the sequence controller 18 controls the timely switching of the gradients, the emission of the radio-frequency pulses with defined phase amplitude and the receipt of magnetic resonance signals. The time base for the radio-frequency system 22 and the sequence controller 18 is provided by a synthesizer 19. The selection of corresponding control programs for the generation of an MR image which, for example, are stored on a DVD 21, and the display of the generated MR image takes place via a terminal 13 that has a keyboard 15, a mouse 16 and a screen 14.

FIG. 2 shows the field of a solid angle permitted according to the invention in k-space. A sphere is defined by a central point 40 and its radius r. The sphere surface has a partial surface A', which corresponds to a solid angle Ω' not permitted. A partial surface A, which corresponds to the sphere surface with regard to the partial surface A', defines the field of a solid angle permitted according to the invention. This field of a solid angle corresponds to a canonical solid angle Ω, which can be calculated according to the following equation (1) on the basis of the canonical solid angle Ω' not permitted.

$$\Omega = 4\pi - \Omega' \quad (1)$$

As the partial surface A' corresponds to a quarter of the sphere surface, the partial surface A corresponds to three quarters or 75% of the sphere surface.

Trajectories are shown with the reference character 31 in FIG. 2, each of which also define a readout direction which is characterized by the arrow at the respective end of the trajectory. If the readout direction of each trajectory 31 is regarded as a vector that runs through the central point of the sphere 40, each readout direction in the readout direction defines a point on the surface of the sphere. The MR data that were collected along the trajectory 31 in the readout direction is only taken into consideration in the reconstruction of the MR image if this point is on the partial surface A.

The primary readout direction is characterized by the reference character 32 which is in the center of the permitted field of a solid angle. If the primary readout direction 32 is envisaged as a vector which runs through the central point of the sphere 40, the primary readout direction in the primary readout direction 32 defines a point 41 on the surface of the sphere. The shortest distance between a point on the boundary line 42 of the partial surface A to this point 41 is the same for all the points on the boundary line 42. Therefore, the point 41 is in the center of the partial surface A and the primary readout direction 32 in the center of the field of a solid angle defined by the partial surface A.

Figure 3A:
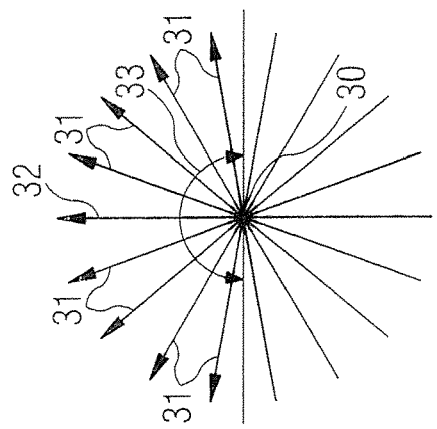
FIG. 3a shows isotropic, two-dimensional trajectories, while in FIGS. 3b and 3c the two-dimensional trajectories are restricted to the field of a solid angle.

FIG. 3a shows radial trajectories 31 for a two-dimensional case in k-space. These trajectories 31 all run through a central point 30 and are isotropically distributed.

Figure 3B:
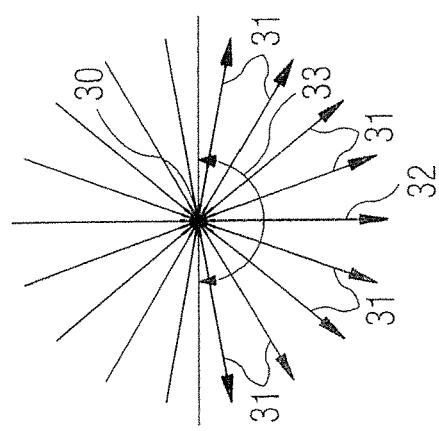

FIG. 3b shows a primary readout direction 32 in a negative ky direction or at an angle of 90°, wherein this primary readout direction 32 defines an angular field 33 restricted to 180°, which in this case is from 0° to 180°. It can be seen that the linear progression of the trajectories 31 in FIG. 3b corresponds to the linear progression of the trajectories 31 in FIG. 3a. However, as only the angular field 33 from 0° to 180° is permitted in the embodiment according to the invention of FIG. 3b, the readout direction of all the trajectories which were originally in the angular field from 180° to 360° was reversed and/or the original readout direction of these trajectories was rotated by 180° so that each trajectory 31 was then in the permitted angular field 33.

Figure 3C:
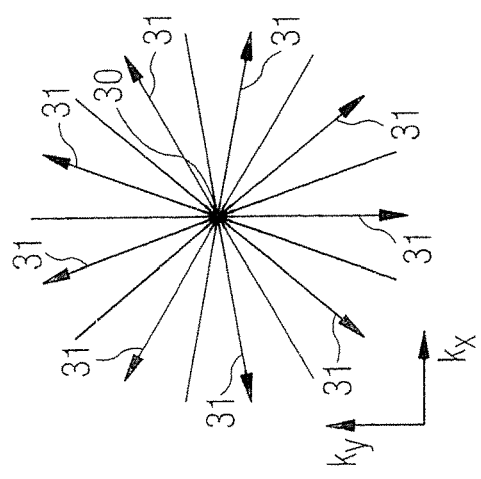

FIG. 3c shows a primary readout direction 32 in a positive ky direction or at an angle o of (270° (−90°). The primary readout direction 32 shown in FIG. 3c also defines an angular field 33 restricted to 180° which in this case is from 180° to 360°. The linear progression of the trajectories 31 in FIG. 3c corresponds to the linear progression of the trajectories 31 in FIGS. 3a and 3b. However, as only the angular field 33 from 180° to 360° is permitted in the embodiment according to the invention of FIG. 3c, based on the readout direction of the trajectories from FIG. 3a which were originally in the angular field of 0° to 180°, this was reversed so that now the readout direction of each trajectory 31 is in the permitted angular field 33.

Because the readout directions in the embodiments in FIGS. 3b and 3c only overscore an angular field of 180°, at most trajectories with readout directions at the edge of the angular field (at 0° and 180°) can run antiparallel. In contrast, no trajectories with antiparallel readout directions exist precisely in the region of the primary readout direction 32.

FIG. 4 shows a flowchart of a first embodiment of the method according to the invention.

In step S1, a primary readout direction and with it an associated field of a solid angle (three-dimensional case) or angular field (two-dimensional case) is determined, in the center of which is the primary readout direction. In step S2 trajectories are determined and in step S3 the MR data is collected along these trajectories.

Steps S4 to S6 examine the MR data which is used for the reconstruction of the MR image. To this end, step S4 examines whether the readout direction of the trajectory is within the field of a solid angle defined in step S1 for each trajectory. In step S5 the MR data are identified as the only MR data to be taken into consideration for the reconstruction of the MR image if this is the case.

If it is recognized that all the trajectories have been examined in step S6, the MR image is reconstructed in step S7 on the basis of only the MR data identified in step S5.

FIG. 5 shows a flowchart of a second embodiment of the method according to the invention.

In step S11, as in step S1 (FIG. 4), a primary readout direction and with it an associated field of a solid angle (three-dimensional case) or angular field (two-dimensional case) is determined, in the center of which is the primary readout direction. Step S12 determines trajectories and the sequence in which these trajectories are to be scanned.

Subsequently, steps S13 to S15 are performed for all the predetermined trajectories. Step S13 examines whether the readout direction of the respective trajectory is outside the field of a solid angle and/or angular field in step S11. The original readout direction in step S14 is only inverted or reversed if this is the case. Subsequently, MR data is collected in the readout direction along the respective trajectory in step S15.

Step S16 examines whether all the trajectories determined in step S12 have been scanned. If so, an MR image is reconstructed on the basis of the collected MR data in step S17.

In the method according to FIG. 4, k-space is scanned along radial trajectories with arbitrary readout directions. However, only that MR data which was scanned along trajectories with a readout direction within the previously defined field of a solid angle is used or included for the reconstruction of the MR image. In other words, numerous items of MR data is collected but not used to reconstruct the MR image.

In contrast, before the collection of the MR data the method according to FIG. 5 examines whether the readout direction of a trajectory is within the predetermined field of a solid angle. If this is not the case, the readout direction is inverted and the MR data is collected along the trajectory in the inverted readout direction. The MR image is then reconstructed on the basis of all the collected MR data.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) image of a predetermined volume of an object, comprising:
   operating an MR data acquisition scanner to acquire MR data from a volume section of a subject and entering the acquired MR data into a memory organized as k-space along radial trajectories in k-space, with each of said trajectories being assigned a readout direction in which the MR data in that respective trajectory were acquired;
   in a computer having access to said memory, reconstructing an MR image from the MR data in k-space by executing a reconstruction algorithm wherein only MR data in k-space are used for constructing said MR image that were collected along trajectories with a readout direction that is restricted to the field of a solid angle defined by a partial surface of a sphere, said partial surface comprising at most 75% of a total surface of the sphere; and
   in said computer, defining a direction from a central point of said sphere to an imperfection represented by said MR data in k-space, and determining a primary readout direction dependent on said defined direction, and determining said field of said solid angle with said primary readout direction being situated in the center of the field of the solid angle.

2. A method as claimed in claim 1 comprising operating said MR data acquisition scanner to acquire said MR data only along said trajectories with a readout direction restricted to said field of said solid angle, and then using all of the MR data in k-space in said reconstruction algorithm.

3. A method as claimed in claim 1 comprising collecting said MR data along radial trajectories that all proceed through a same point, which corresponds to the central point of said sphere.

4. A method as claimed in claim 1 wherein said partial surface is 50% of said total surface of the sphere.

5. A method as claimed in claim 1 comprising collecting said MR data along radial trajectories that are in a plane, and wherein said field of said solid angle corresponds to an angular field that is restricted to 180°.

6. A method as claimed in claim 1 comprising determining said primary readout direction dependent on at least one of a material of the imperfection, a position of the imperfection, and properties of a data acquisition sequence used to operate the MR data acquisition scanner to acquire said MR data.

7. A method as claimed in claim 1 comprising collecting said MR data along radial trajectories by:
- determining a plurality of arbitrary linear trajectories that all pass through a central point of said sphere;
- determining a sequence of trajectories among said arbitrary linear trajectories; and
- collecting the MR data along the trajectories in the determined sequence with a readout direction of one of said trajectories being reversed when that respective readout direction is outside of said field of the solid angle.

8. A magnetic resonance (MR) apparatus comprising:
- an MR data acquisition scanner;
- a computer configured to operate said MR data acquisition scanner to acquire MR data from a volume section of a subject and to enter the acquired MR data into a memory organized as k-space along radial trajectories in k-space, with each of said trajectories being assigned a readout direction in which the MR data in that respective trajectory were acquired;
- said computer being configured to reconstruct an MR image from the MR data in k-space by executing a reconstruction algorithm wherein only MR data in k-space are used for constructing said MR image that were collected along trajectories with a readout direction that is restricted to the field of a solid angle defined by a partial surface of a sphere, said partial surface comprising at most 75% of a total surface of the sphere; and
- said computer being configured to define a direction from a central point of the sphere to an imperfection represented by said MR data in k-space, and to determine a primary readout direction dependent on said defined direction, and to determine said field of said solid angle with said primary readout direction being situated in the center of the field of the solid angle.

9. A non-transitory, computer-readable data storage medium encoded with programming instructions, said storage medium being loaded into a computer system of a magnetic resonance (MR) apparatus that comprises an MR data acquisition scanner, and said programming instructions causing said computer system to:
- operate an MR data acquisition scanner to acquire MR data from a volume section of a subject and entering the acquired MR data into a memory organized as k-space along radial trajectories in k-space, with each of said trajectories being assigned a readout direction in which the MR data in that respective trajectory were acquired;
- reconstruct an MR image from the MR data in k-space by executing a reconstruction algorithm wherein only MR data in k-space are used for constructing said MR image that were collected along trajectories with a readout direction that is restricted to the field of a solid angle defined by a partial surface of a sphere, said partial surface comprising at most 75% of a total surface of the sphere; and
- define a direction from a central point of the sphere to an imperfection represented by said MR data in k-space, and determine a primary readout direction dependent on said defined direction, and determine said field of said solid angle with said primary readout direction being situated in the center of the field of the solid angle.

* * * * *